(12) United States Patent
Maget et al.

(10) Patent No.: US 7,019,384 B2
(45) Date of Patent: Mar. 28, 2006

(54) INTEGRATED, TUNABLE CAPACITANCE DEVICE

(75) Inventors: Judith Maget, Taufkirchen (DE); Marc Tiebout, München (DE)

(73) Assignee: Infineon Technologies AG, Munich (DE)

( * ) Notice: Subject to any disclaimer, the term of this patent is extended or adjusted under 35 U.S.C. 154(b) by 143 days.

(21) Appl. No.: 10/678,385

(22) Filed: Oct. 3, 2003

(65) Prior Publication Data

US 2004/0065939 A1 Apr. 8, 2004

Related U.S. Application Data

(63) Continuation of application No. PCT/DE02/01206, filed on Apr. 3, 2002.

(30) Foreign Application Priority Data

Apr. 3, 2001 (DE) ............... 101 16 557

(51) Int. Cl.
*H01L 29/93* (2006.01)
(52) U.S. Cl. .................................... 257/595
(58) Field of Classification Search ............... 257/321, 257/480, 595, 596, 598, 600, 601, 602
See application file for complete search history.

(56) References Cited

U.S. PATENT DOCUMENTS

| 5,965,912 A | 10/1999 | Stolfa et al. | |
| 6,034,388 A | 3/2000 | Brown et al. | |
| 6,172,378 B1 | 1/2001 | Hull et al. | |
| 6,351,020 B1 | 2/2002 | Tarabbia et al. | |
| 6,400,001 B1* | 6/2002 | Manzini et al. | 257/601 |
| 6,521,506 B1* | 2/2003 | Coolbaugh et al. | 438/379 |
| 6,621,128 B1* | 9/2003 | Lee et al. | 257/369 |
| 2003/0067026 A1* | 4/2003 | Bulucea | 257/303 |

FOREIGN PATENT DOCUMENTS

| EP | 1 024 538 A1 | 8/2000 |
| JP | 03147376 A | 6/1991 |

OTHER PUBLICATIONS

Svelto, F. et al.: "A Three Terminal Varactor for RF IC's in Standard CMOS Technology", IEEE Transactions on Electron Devices, vol. 47, No. 4, Apr. 2000, pp. 893-895.

(Continued)

*Primary Examiner*—Carl Whitehead, Jr.
*Assistant Examiner*—Jennifer M. Dolan
(74) *Attorney, Agent, or Firm*—Laurence A. Greenberg; Werner H. Stemer; Ralph E. Locher (57) ABSTRACT

An integrated, tunable capacitance device includes a semiconductor region, which is, preferably, N-doped, formed in a semiconductor body, having an insulating thick oxide region, which areally adjoins the main side of the semiconductor body, and having a thin oxide region, which, likewise, adjoins the main side and is disposed above the semiconductor region and also has a smaller layer thickness than the thick oxide region. A gate electrode is provided on the thin oxide region and terminal regions are provided in the semiconductor region. The capacitance described has a larger tuning range compared with transistor varactors. The integrated, tunable capacitance can be used, for example, in LC oscillators of integrated VCOs.

23 Claims, 4 Drawing Sheets

OTHER PUBLICATIONS

Castello, R. et al.: "A +-30% Tuning Range Varactor Compatible with future Scaled Technologies", IEEE, Symposium on VLSI Circuits Digest of Technical Papers, 1998, pp. 34-35.

Wong, W. M. Y. et al.: "A Wide Tuning Range Gated Varactor", IEEE Journal of Solid-State Circuits, vol. 35, No. 5, May 2000, pp. 773-779.

Tiebout, M.: "A Fully Integrated 1.3GHz VCO for GSM in 0.25μm Standard CMOS with a Phasenoise of—142dBc/Hz at 3MHz Offset", European Microwave Week, 2000, 4 pages.

Andreani, P. et al.: "On the Use of MOS Varactors in RF VCO's", IEEE Journal of Solid-State Circuits, Brief Papers, vol. 35, No. 6, Jun. 2000, pp. 905-910.

Porret, A.-S. et al.: "Design of High-Q Varactors for Low-Power Wireless Applications Using a Standard CMOS Process", IEEE Journal of Solid-State Circuits, vol. 35, No. 3, Mar. 2000, pp. 337-345.

* cited by examiner

INTEGRATED, TUNABLE CAPACITANCE DEVICE

CROSS-REFERENCE TO RELATED APPLICATION

This application is a continuation of copending International Application No. PCT/DE02/01206, filed Apr. 3, 2002, which designated the United States and was not published in English.

BACKGROUND OF THE INVENTION

Field of the Invention

The present invention relates to an integrated, tunable capacitance device.

Integrated, tunable capacitances are used in large numbers for the construction of resonant circuits. Such resonant circuits are constructed as an LC oscillator, for example, in which the capacitance is usually formed as a frequency-tunable element. The resonant circuit frequency-determining inductances, usually realized in the form of coils, in this case generally have a constant inductance value.

Voltage-controlled oscillators (VCOs) have, as output signal, a frequency-adjustable high-frequency signal that can be tuned depending on a voltage present on the input side. To obtain a large tuning range, it is necessary, on account of the usually constant inductance already mentioned, to strive to obtain a large variation ratio of the capacitance, that is to say, a large quotient of maximum and minimum capacitance that can be set.

Furthermore, it is desirable, for example, when the integrated, tunable capacitance is employed in a VCO, to obtain a high quality factor because the quality factor of the LC resonant circuit is incorporated quadratically into the phase noise of the circuit. In such a case, the quality factor of the tunable capacitance can be determined from the series circuit of the variable capacitance C and series resistances R that are possibly present, using the formula $Q=1/\omega RC$, where $\omega$ is equal to the operating frequency, R is equal to the series resistance, and C is equal to the variable capacitance. Therefore, to obtain high quality factors, it is necessary to strive to make the series resistance as small as possible with respect to the capacitance.

Integrated, tunable capacitances can be produced in various technologies and with various constructions, examples of which prior art include the following:

Variable-capacitance diodes formed as tunable capacitances, which can be integrated either as single-ended or as differentially designed devices, cf., A. S. Porret, T. Melly, C. C. Enz, E. A. Vittoz "Design of High-Q varactors for Low-Power Wireless Applications Using a Standard CMOS Process", IEEE Journal of Solid-State Circuits, Vol. 35, No. 3, March 2000, pp. 337–345;

The tunable capacitances may also be formed as NMOS or PMOS field-effect transistors with short-circuited source/drain regions, for example, in N-type wells, see, for example, P. Andreani and S. Mattisson, "On the Use of MOS Varactors in RF VCO's", IEEE Journal of Solid-State Circuits, Vol. 35, No. 6, June 2000, pp. 905–910;

M. Tiebout, "A Fully Integrated 1.3 GHz VCO for GSM in 0.25 μm Standard CMOS with a Phasenoise of −142 dBc/Hz at 3 MHz Offset", European Microwave Week 2000, which, furthermore, discloses a VCO with NMOS varactors.

A differentially operating PMOS-FET, an NMOS-FET in an n-type well, and, also, an NMOS-FET in an n-type well without connected diffusion regions, as further disclosed in the above-mentioned literature reference to Porret et al.;

An NMOS field-effect transistor formed in an n-type well with p+-type extraction regions is specified in F. Svelto et al.: "A Three Terminal Varactor for RFIC's in Standard CMOS Technology", IEEE Transactions on Electron Devices, Volume 47, No. 4, April 2000, pages 893–895; and Finally, Wallace Ming Yip Wong et al. "A Wide Tuning Range Gated Varactor", IEEE Journal of Solid-State Circuits, Vol. 35, No. 5, May 2000, pp. 773–779, which specifies a so-called gated varactor.

Of the previous solutions mentioned for providing a tunable capacitance, hitherto those formed as a gated varactor and as an NMOS field-effect transistor in an n-type well with p+-type extraction regions are those with the largest possible tuning range to date. In such a case, the high-frequency signal is usually applied to the gate terminal, a second terminal is used for feeding the tuning voltage, and a third terminal is used through application of a further voltage for increasing the tuning range.

The total effective capacitance of such a component depends on its respective operating state, such as inversion, depletion or accumulation or enhancement, and is determined by the voltages at the nodes mentioned. In such a case, the generally constant parasitic capacitances of a device of this type, generally, always have an additive influence.

In inversion, as well as in accumulation, the maximum capacitance that can be obtained results as the sum of the gate oxide capacitance, determined by gate area and thickness of the gate oxide layer, and from the constant parasitic capacitances between gate and the source/drain regions. By contrast, the minimum capacitance that can be obtained results, in depletion, as a series circuit of the gate oxide capacitance and the depletion capacitance and, in parallel therewith, the constant parasitic capacitances between gate and the source/drain regions. For a given gate area and a given technology that determines the gate oxide layer thickness, the tuning range can, consequently, be increased only by reducing the minimum capacitance and/or the constant capacitances.

In order, when the tunable capacitance is used, for example, in an LC-VCO, to obtain an acceptable phase noise of the VCO, it is desirable to keep down series resistances, as explained above, in the LC circuit as well.

For such a purpose, as is customary in the case of high-frequency transistors, use is made of so-called finger structures and also transistors having a short gate length. By contrast, the parasitic capacitances are largely independent of the gate length. Only the variable part of the capacitances decreases with the gate length. The smaller the gate length, therefore, the larger the parasitic capacitances are in comparison with the variable capacitances. Therefore, to obtain higher quality factors, it has been necessary hitherto to accept obtaining a smaller tuning range. The converse statement also holds true: the larger the gate length, the lower the significance of the parasitic capacitances and, accordingly, a larger tuning range can be obtained. However, a larger gate length leads to increasing series resistances and, thus, to a poorer quality factor.

SUMMARY OF THE INVENTION

It is accordingly an object of the invention to provide an integrated, tunable capacitance that overcomes the hereinafore-mentioned disadvantages of the heretofore-known devices of this general type and that has a large tuning range in conjunction with a high quality factor.

With the foregoing and other objects in view, there is provided, in accordance with the invention, an integrated, tunable capacitance device, including a semiconductor body being of a first conductivity type and having a semiconductor region with a terminal region for applying a tuning voltage, at least one first insulating region, which is introduced into the semiconductor and has a first layer thickness, a second insulating region applied to the semiconductor body adjoining the at least one first insulating region and having a common interface with the semiconductor region, the second insulating region having a second layer thickness less than the first layer thickness, a gate electrode on the second insulating region, the semiconductor region having a partial region disposed below the gate electrode, the at least one first insulating region being disposed between the terminal region and the partial region, and a region being introduced into the semiconductor body for connection to a reference-ground potential, the region adjoining the semiconductor region, being of a second conductivity type, and being highly doped.

With the objects of the invention in view, there is also provided an integrated, tunable capacitance device, including a semiconductor body being of a first conductivity type and having a semiconductor region having a terminal region for applying a tuning voltage and at least one first insulating region having a first layer thickness, a second insulating region at the semiconductor body adjoining the at least one first insulating region and having a common interface with the semiconductor region, the second insulating region having a second layer thickness less than the first layer thickness, a gate electrode at the second insulating region, the semiconductor region having a partial region disposed below the gate electrode, the at least one first insulating region being disposed between the terminal region and the partial region, and a region being introduced into the semiconductor body for connection to a reference-ground potential, the region adjoining the semiconductor region, being of a second conductivity type, and having a doping concentration higher than a doping concentration of the semiconductor body.

The term semiconductor region is understood to be a region usually designated as an active region of a semiconductor.

The term layer thickness is meant in a direction orthogonal to the main side of the semiconductor body.

The term main side of the semiconductor body is understood to be its active front side.

The layer thickness of the first insulating layer or of the first insulating region is significantly greater than that of the second insulating layer or of the second insulating region.

The first insulating layer may, preferably, be disposed in a manner directly adjoining the semiconductor region of the first conductivity type.

The gate region may be formed such that, when the integrated, tunable capacitance is used in an LC oscillator, it is possible to feed a high-frequency signal. The terminal for the application of a tuning voltage to the semiconductor region may be embodied, for example, as a substrate terminal or as a well terminal.

The described construction of the integrated, tunable capacitance makes it possible to obtain low parasitic capacitances and, thus, a large tuning range. In particular, with the at least one region having a first layer thickness as described, it is possible to obtain a large distance between gate terminal and well or substrate terminals.

The configuration may, preferably, be formed symmetrically so that a first insulating layer having a comparatively large layer thickness is in each case provided between the terminal for the application of a tuning voltage and the gate region.

Below the second insulating layer, during operation of the configuration, depending on the applied tuning voltage, there forms in the semiconductor region either an accumulation layer or a space charge zone in depletion.

The total effective capacitance of the gate region relative to all the remaining circuit nodes is regarded as variable capacitance.

In such a case, the total effective capacitance is formed as a series circuit including the constant gate capacitance and the tuning-voltage-dependent space charge zone capacitance. This series circuit of the total effective capacitance is disposed in parallel with the parasitic capacitances between gate region and the terminal for the application of the tuning voltage.

The integrated, tunable capacitance may be formed in a finger structure known from high-frequency transistor structures.

The gate region may, preferably, be formed as a bulk region.

Because the integrated, tunable capacitance described has a large tuning range on account of the low parasitic capacitances that can be achieved, it can, preferably, be used in LC resonant circuits with a variable frequency, for example, in voltage-controlled oscillators. Such oscillators can, preferably, be used in high-frequency applications, for example, in transmitting and receiving parts for mobile radio.

In a preferred embodiment of the present invention, the gate region completely covers insulating regions having a low, second layer thickness and partly covers regions having a larger, at least first layer thickness. In particular, the gate electrode completely covers the second insulating region and partly covers the first insulating region.

The partial coverage of the insulating regions having a first layer thickness is dictated by production because it must be ensured that the original doping of the semiconductor region below the insulating layer having a second layer thickness does not change during the production process. The overlap is not necessary for the function of the component according to the invention.

In accordance with another feature of the invention, the gate electrode adjoins the at least one first insulating region along its periphery.

In the case of such a symmetrical construction of the integrated tunable capacitance, the semiconductor region below the insulating layer having the second layer thickness is enclosed laterally almost completely or completely by one or more insulating regions having the first layer thickness.

By virtue of the insulating region having a first layer thickness, and by virtue of the fact that this region is partly overlapped by the gate region along the main side of the semiconductor body, there are no overlap capacitances between gate region above insulating regions having a second layer thickness and substrate or well terminals for the application of a tuning voltage. In addition, the capacitances between the gate region of the overlap region and the semiconductor regions adjoining the insulating region having a first layer thickness are very small because the first layer thickness is comparatively large and, by way of example, is significantly greater than that of a gate oxide layer.

Because, on account of the insulating regions having the first layer thickness, the well or substrate contacts are at a larger spatial distance from the gate region than from the source/drain regions in transistor varactors, the voltage-independent, constant gate fringing capacitance is reduced. In comparison with conventional PMOS- or NMOS-FET varactors, the configuration described achieves a significantly reduced sum of the parasitic capacitances, thereby further increasing the maximum tuning range that can be obtained.

In accordance with a further feature of the invention, the semiconductor region is formed as a well with at least one well terminal region of the first conductivity type, which has a higher dopant concentration than the rest of the semiconductor region.

The semiconductor body may be formed from a substrate of the second conductivity type that is doped comparatively lightly.

In accordance with an added feature of the invention, the at least one well terminal region is configured for the application of a tuning voltage.

On account of the large distance between gate region and well terminal region that is obtained by virtue of the first insulating layer having the first layer thickness, lower parasitic capacitances are to be expected in the case of the present embodiment with a well than in the case of known capacitances formed as varactor transistors.

In accordance with an additional feature of the invention, there is provided a region for connection to reference-ground potential at the main side of the semiconductor body, which is connected to the semiconductor region of the first conductivity type and is of a second conductivity type and also highly doped.

Relative to the gate width, the region for connection to reference-ground potential takes up only a small area in relation to the area requirement of the first insulating layers.

As a result thereof, an improved quality factor may be produced depending on geometry and doping conditions in depletion. The advantages with regard to a large tuning range are preserved to the greatest possible extent on account of the small relative area.

In accordance with yet another feature of the invention, there is provided a region for connection to the well contacts at the main side of the semiconductor body, which is connected to the semiconductor region of the first conductivity type and is, likewise, of the first conductivity type, but is doped more highly than the semiconductor region of the first conductivity type, and is connected to the at least one well terminal region.

Relative to the gate width of the integrated capacitance, the region for connection to the well contacts, in the same way as the region for connection to the reference-ground potential, is provided only at few locations in relation to the first insulating layer or with a small area proportion. The described region for connection to the well contacts takes effect in the case of enhancement or accumulation and, likewise, leads to a significantly improved quality factor in conjunction with a practically unchanged tuning range.

Furthermore, the described region for connection to the well contacts enables large gate lengths of the integrated capacitance in conjunction with a high quality factor and, thus, a saving of area overall.

In accordance with yet a further feature of the invention, the gate region is formed in a polycrystalline layer.

In accordance with yet an added feature of the invention, the first insulating layer is an oxide region. Oxide layers having a comparatively large layer thickness measured orthogonally to the main side or active front side are also referred to as a thick oxide layer.

In accordance with yet an additional feature of the invention, the first insulating layer is a so-called shallow trench isolation (STI) region.

In accordance with a concomitant feature of the invention, the second insulating layer is an oxide region.

Oxide layers having a comparatively small layer thickness that areally directly adjoin a gate region are also referred to as gate oxides.

Other features that are considered as characteristic for the invention are set forth in the appended claims.

Although the invention is illustrated and described herein as embodied in an integrated, tunable capacitance, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE PREFERRED EMBODIMENTS

Figure 1:
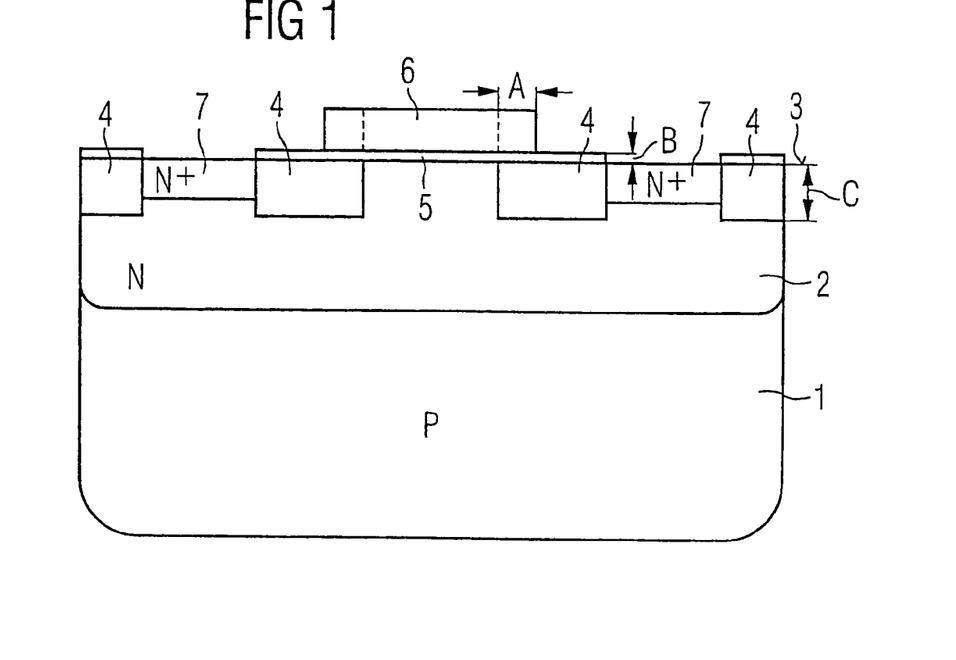
FIG. 1 is a cross-sectional view through a first exemplary embodiment of an integrated, tunable capacitance according to the invention.

Referring now to the figures of the drawings in detail and first, particularly to FIG. 1 thereof, there is shown an integrated, tunable capacitance having a p-doped semiconductor body 1, which is formed as a substrate, having an n-doped semiconductor region 2, which is formed in the semiconductor body 1, and having a main side 3, which is the active front side of the semiconductor body 1.

To form the desired integrated capacitance, two first insulating layers 4 disposed symmetrically with respect to one another are, furthermore, provided, which layers areally adjoin the main side 3 and are also spaced apart from one another by the active semiconductor region 2. A second insulating layer 5, which is embodied as a gate oxide layer, is formed above the semiconductor region 2 and where the semiconductor region 2 areally adjoins the main side 3. Disposed above the gate oxide layer 5 is a gate region 6 made of polycrystalline material, which completely covers the second insulating layer 5 and partly covers the adjoining first insulating layers 4. On sides of the first insulating layers 4 that are remote from the semiconductor region 2, an n+-doped well terminal contact 7 is in each case provided in a manner adjoining the main side 3, which well terminal contact directly adjoins the thick oxide regions 4.

Figure 2:
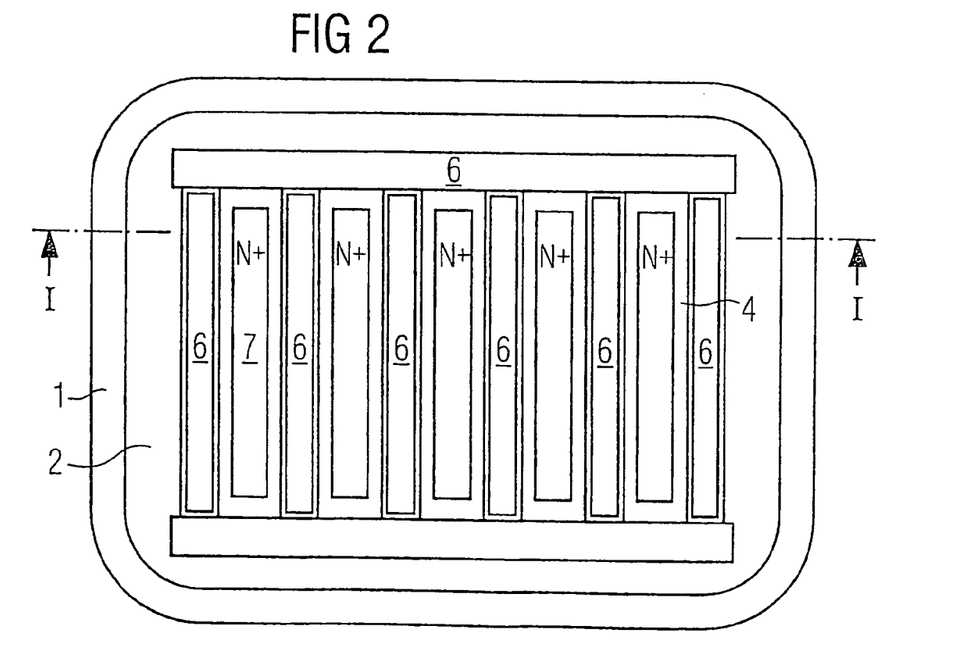
FIG. 2 is a plan view of the integrated, tunable capacitance of FIG. 1.

FIG. 2 shows a plan view of the first exemplary embodiment of a tunable capacitance according to the invention as shown on the basis of the cross-section in FIG. 1. The n-doped well region 2 embedded in p-type substrate 1 is clearly discernable. Also visible are polygate regions 6 above thick oxide regions 4 (not depicted) and also gate regions 6 above thin oxide regions 5 (likewise not depicted). In addition, thick oxide regions 4 are provided wherever no n+-type or p+-type regions are formed.

The capacitance according to the invention is accordingly situated in an n-type well 2. A polygate track 6 runs in a finger structure that is contact-connected on both sides above gate oxide 5, in a manner overlapping thick oxide regions 4. n+-type regions 7, embodied as well contacts, are situated on both sides in a manner adjoining the thick oxide region 4. Depending on the operating state, that is to say, the voltage at the gate 6 and the well contacts 7, an accumulation layer or a space charge zone forms below the gate oxide 5 in the semiconductor region 2. In the case of use in an LC oscillator, the high-frequency signal is present at the gate terminal 6, and a terminal at the well contacts 7 can be utilized for feeding the tuning voltage.

The capacitance in accordance with FIGS. 1 and 2 has a larger tuning range compared with MOS-based transistor varactors. The tuning range is increased, in particular, because the constant parasitic capacitances are reduced. This is because, firstly, no overlap capacitances whatsoever are formed between the polygate region 6 above the gate oxide 5 and the well contacts 7. In addition, the overlap capacitances between the polygate region 6 above the thick oxide region 4 and the semiconductor regions adjoining the thick oxide region 4 are very small because the layer thickness of the thick oxide 4 is significantly greater than that of the oxide 5. Furthermore, the well contacts 7 are at a greater spatial distance from the polygate 6 than the source/drain regions in transistor varactors. As a result, the lateral voltage-independent constant gate fringing capacitances are reduced further.

With regard to the dimensioning of the geometrical dimensions of the exemplary embodiment described, further advantages can be achieved with the considerations presented in the text below.

To further reduce the parasitic capacitances and, thus, to increase the tuning range, the sum of the parasitic capacitances is intended to be as small as possible, which sum results from the overlap capacitances Cü between gate region 6 above thick oxide 4 and the semiconductor regions adjoining thick oxide 4 and also from the fringing leakage capacitances between gate region 6 and well terminals 7.

With the aid of the formulae of a plate capacitor, the overlap capacitance Cü can be specified to an approximation in a simple formula:

$$C\ddot{u} = \frac{\varepsilon_0 \cdot \varepsilon_r \cdot A}{B + C},$$

where:
$\varepsilon_0$ is equal to the permittivity of free space;
$\varepsilon_r$ is equal to the relative permittivity of the insulating material of the oxide layers;
A is equal to the overlap between gate region 6 and thick oxide region 4;
B is equal to the layer thickness of the second insulating layer 5; and
C is equal to the layer thickness of the first insulating layer 4.

In the case of a customary transistor varactor, by contrast, in which no thick oxide regions 4 are provided, the overlap capacitance Cü results to an approximation as:

$$C\ddot{u} = \frac{\varepsilon_0 \cdot \varepsilon_r \cdot A''}{B}.$$

In this case, however, A" denotes the overlap between the gate electrode 6 and implantation regions of source and drain, spaced apart from one another by the gate oxide layer 5.

The fringing leakage capacitances Cr cannot easily be formulated in analytical formulae; however, Cr depends directly on the distance between the gate electrode and the n+-type regions. The greater this distance, the smaller the leakage capacitance Cr becomes. In conventional transistor varactors, the distance between the gate electrode and the drain/source regions is merely a fraction of what can be achieved by virtue of the thick oxide regions in the case of the present invention.

Figure 3:
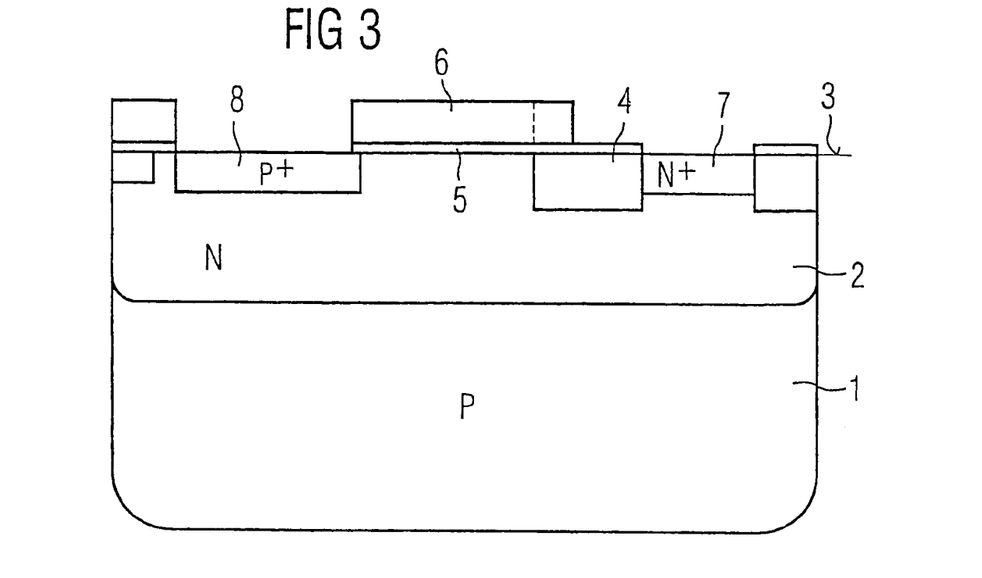
FIG. 3 is a cross-sectional view through a second exemplary embodiment of an integrated, tunable capacitance according to the invention.

FIG. 3 shows a development of the tunable capacitance in accordance with FIGS. 1 and 2.

Besides the regions already explained for FIG. 1, namely substrate 1, semiconductor region 2, main side 3, thick oxide layer 4, thin oxide layer 5 and gate region 6, and also the well contact 7, the cross-section of FIG. 3 additionally has a p+-doped region 8, which adjoins the semiconductor region 2 lying below the gate oxide 5 and only slightly overlaps the gate region 6 and the gate oxide 5. Moreover, the p+-type region 8, which is formed for the connection of the active region to reference-ground potential at the main side 3 of the semiconductor body 1, is provided at only few locations relative to the gate width in relation to thick oxide regions 4 that it replaces there.

Figure 4:
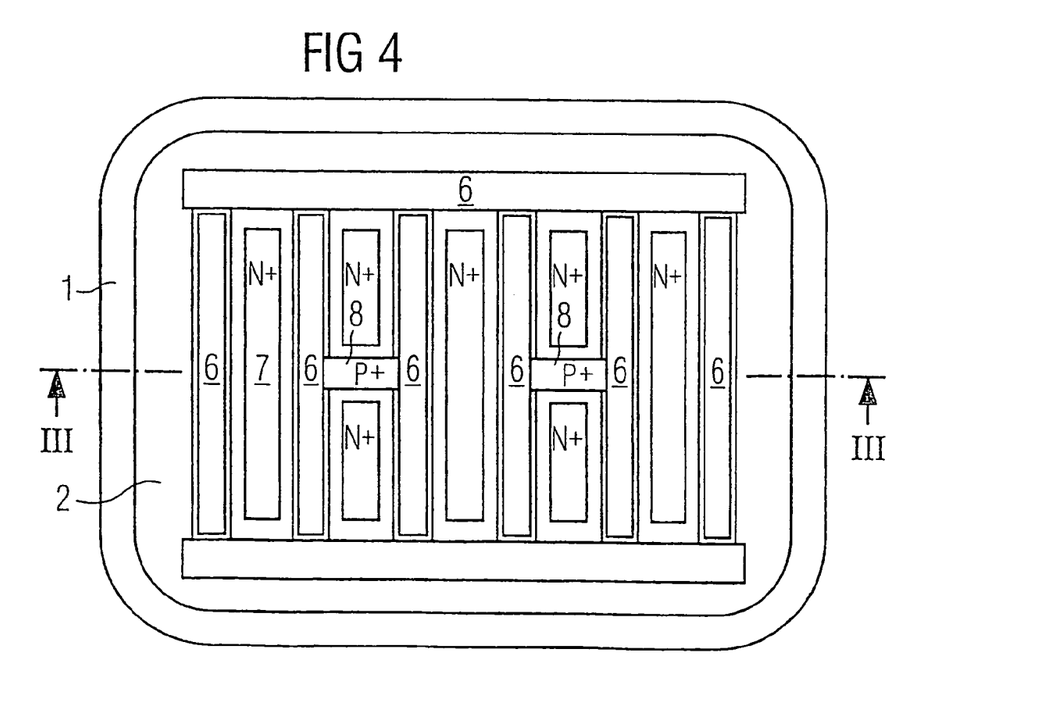
FIG. 4 is a plan view of the integrated, tunable capacitance of FIG. 3.

FIG. 4 shows, in a plan view of the second exemplary embodiment in accordance with FIG. 3, how, for example, the desired comparatively low area proportion of the p+-type regions 8 could be achieved. Apart from the p+-type regions 8 that replace the thick oxide regions 4 and well terminal contacts 7 in each case on one side of the gate tracks 6 and only at few locations of the capacitance, FIG. 4 corresponds to the exemplary embodiment of FIG. 2. The linking of the active region 2 below the gate oxide 5 to a p+-type region 8 and, thus, to ground can make it possible to improve the quality factor in a manner dependent on geometry and doping in depletion. Because such linking relative to the gate width is effected only at few locations, however, the tuning range is practically unimpaired. Rather, the described linking through the P+-type region 8 to reference-ground potential makes it possible, on one hand, to bring the component to deep depletion, that is to say, to reduce the minimum voltage-dependent capacitance and, thus, to increase the tuning range. On the other hand, however, it is possible to reduce the effective series resistance in a manner dependent on geometry and doping because the entire current does not flow through the series resistance of the capacitance but, rather, in part through parasitic capacitances to reference-ground potential or between gate and well contacts.

The last-mentioned effect becomes apparent only in depletion, however.

Figure 5:
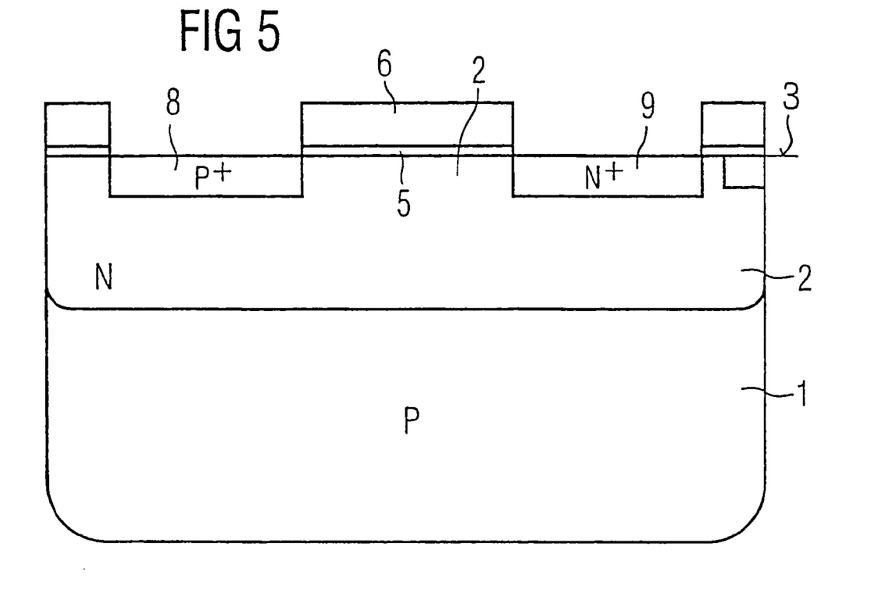
FIG. 5 is a cross-sectional view through a third exemplary embodiment of an integrated, tunable capacitance according to the invention.

FIG. 5 shows a further exemplary embodiment of a tunable capacitance in a development of the subject matter of FIG. 3, in which, besides the p+-type terminal regions 8 already described with reference to FIGS. 3 and 4, additional n+-doped regions 9 are provided at few locations of the component, where they respectively replace the well terminal regions 7 and, also, the thick oxide regions 4. By virtue of the direct contact connection of the active region 2 below the gate oxide 5 with the extended well terminal 9, which is n+-doped, a reduced series resistance is produced in accumulation of the semiconductor region 2, without appreciably impairing the tuning range. This enables the use of large gate lengths and the associated saving of area. Like the terminal regions 8, the terminal regions 9 also take up a comparatively small chip area.

Figure 6:
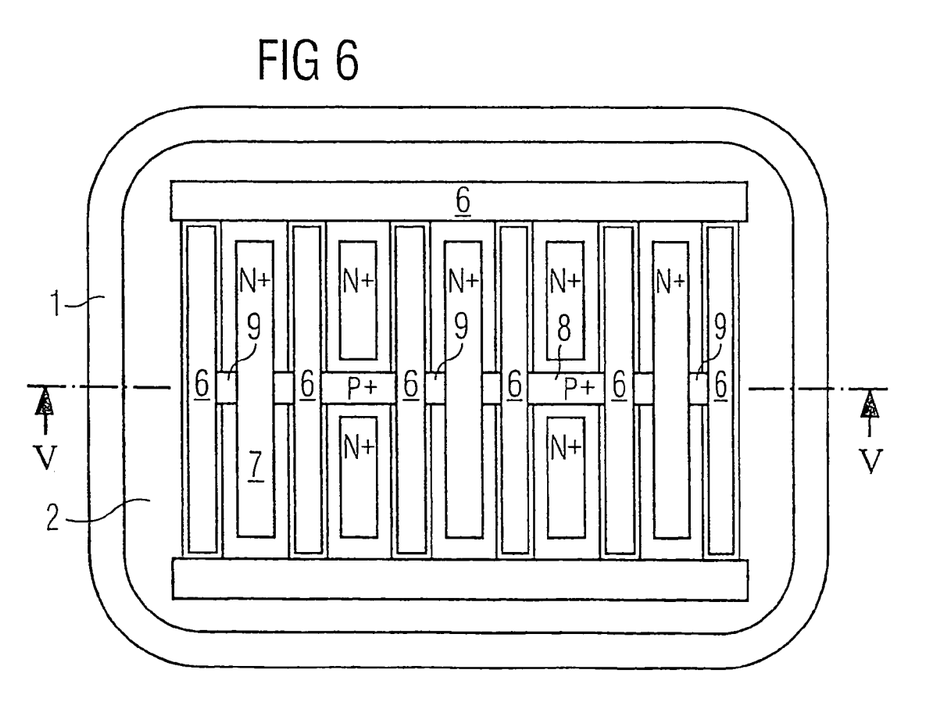
FIG. 6 is a plan view of the integrated, tunable capacitance of FIG. 5.

FIG. 6 correspondingly shows a plan view of the subject matter described in a cross-section in FIG. 5, on the basis of which it can be seen that the described lengthened well terminal regions 9 that only slightly overlap the gate oxide 5 and the gate region 6 are provided only at few locations of the device. Apart from the well terminal regions 9, the illustration of FIG. 6 corresponds to that of FIG. 4 and a repetition of the description can, therefore, be dispensed with at this point. It goes without saying that the further well terminals 9 can also be utilized without the simultaneous use of the p+-type regions 8.

Figure 7:
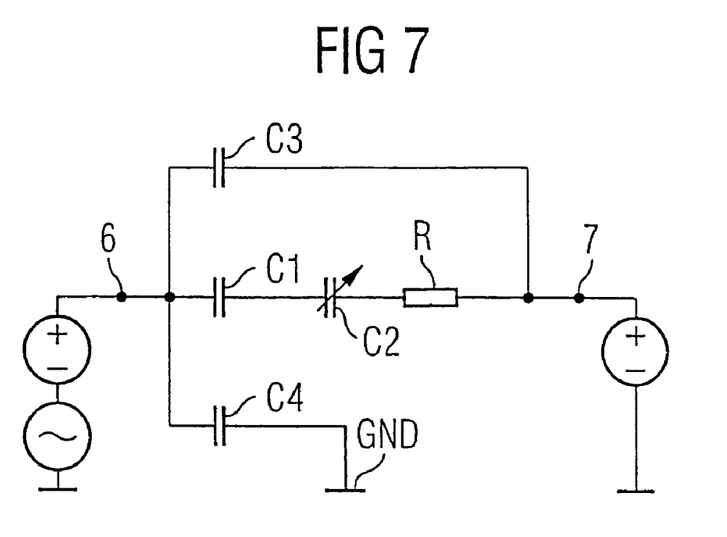
FIG. 7 is a schematic circuit diagram of the adjustable capacitance and of the parasitic elements of an integrated, tunable capacitance according to the invention.

FIG. 7 shows an equivalent circuit diagram for explaining the desired and adjustable and, also, parasitic capacitances and series resistances discussed previously. Specifically, the capacitances and resistances between gate terminal 6, well terminal 7, and reference-ground potential terminal GND are described. The capacitance of the gate oxide 5 is usually constant and is designated by C1. An adjustable capacitance C2, which is established in depletion in the semiconductor region 2, is depicted in series with the constant capacitance C1. Also depicted in series is the series resistance of the capacitance R. The parasitic capacitance C3 is formed in parallel with the series circuit including constant capacitance C1, adjustable capacitance C2, and resistance R, which parasitic capacitance, in this model, includes the parasitic capacitances between gate region 6 and well terminal contacts 7. Finally, a further parasitic capacitance C4 is depicted from the gate region 6 to reference-ground potential GND, the further parasitic capacitance C4 arising as a result of the overlap between gate region 6 and reference-ground potential terminal region 8 and virtually disappearing in the case of the present configuration. In the case of the present principle of the tunable capacitance, the parasitic capacitances C3, C4 are comparatively low, while the adjustable capacitance C2 has a large variation ratio. A large variation range is, thereby, produced for the resulting total capacitance.

Figure 8:
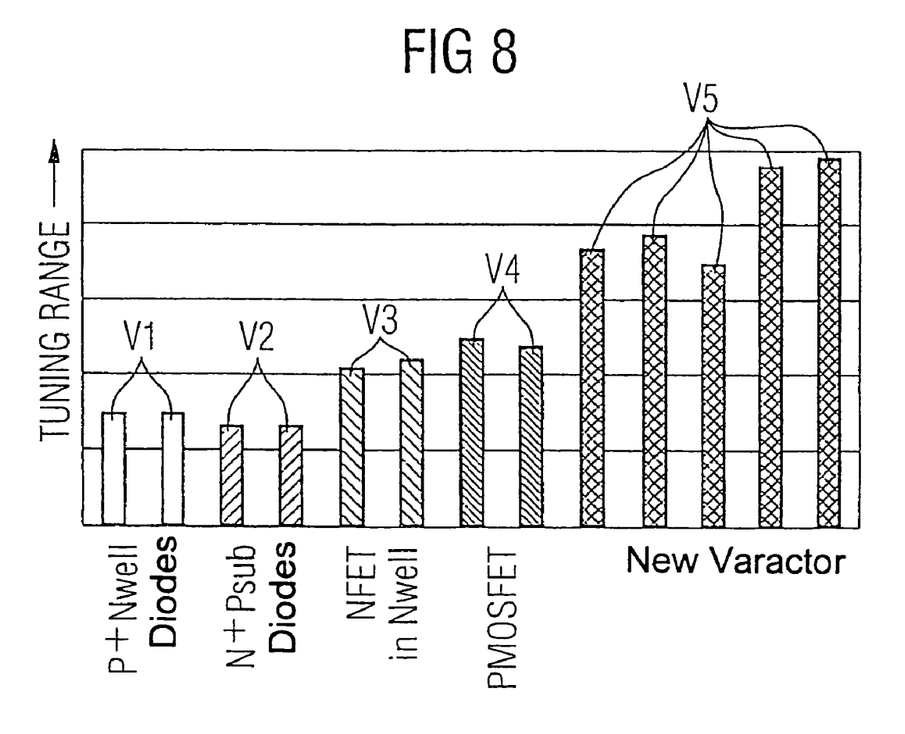
FIG. 8 is a graph illustrating a comparison of the tuning range of different exemplary embodiments of the integrated, tunable capacitance according to the invention-compared with previously known embodiments in a normalized illustration.

Finally, FIG. 8 shows a comparison of the tuning range of varactors, which is plotted in a normalized manner and, in accordance with the object, is intended to be as large as possible, with regard to the exemplary embodiments of the invention V5 in comparison with other conventional varactor designs V1 to V4 mentioned in the introduction to the description. The tuning range of conventional diodes formed in p- or n-type wells is designated by V1. Diodes formed in an n- or p-type substrate have an even smaller tuning range. NMOS-FETS V3 formed in an n-type well and also PMOS-FETS V4 have a larger variation ratio than the diode varactors. It is, furthermore, evident that the tuning range V5 in the case of the present configuration, shown in a plurality of different exemplary embodiments, is significantly improved compared with the previously known solutions V1 to V4.

Depending on the fabrication process used, the well form described, which is embodied as an n-type well in the present case, may also be embodied as a p-type well in a complementary implementation. The reference-ground potential linking is, then, effected by n+-type regions and p+-type well contacts. The polarities n and p of the doping regions that are mentioned in the exemplary embodiment are to be understood only as an example. It goes without saying that the described embodiment in silicon semiconductor material can be applied analogously to fabrication processes not purely based on silicon, with direct semiconductors, for example, gallium arsenide, silicon-germanium, or the like. Apart from the described thick oxide regions 4 embodied as Shallow Trench Isolation (STI), it is also possible to provide all other thick insulating layers as regions having an increased layer thickness.

We claim:

1. An integrated, tunable capacitance device, comprising:
    a semiconductor body having a semiconductor region of a first conductivity type, said semiconductor region having a terminal region for applying a tuning voltage;
    at least one first insulating region being introduced into said semiconductor body and having a first layer thickness;
    a second insulating region applied to said semiconductor body adjoining said at least one first insulating region and having a common interface with said semiconductor region, said second insulating region having a second layer thickness less than said first layer thickness;
    a gate electrode on said second insulating region, said semiconductor region having a partial region disposed below said gate electrode, said at least one first insulating region being disposed between said terminal region and said partial region; and
    a region being introduced into said semiconductor body for connection to a reference-ground potential, said region adjoining said semiconductor region, being of a second conductivity type, and being highly doped, said semiconductor region below said second insulating region under said gate electrode being linked to said region of said second conductivity type and thus to the reference-ground potential to improve a quality factor.

2. The capacitance device according to claim 1, wherein said gate electrode completely covers said second insulating region and partly covers said first insulating region.

3. The capacitance device according to claim 1, wherein said gate electrode has a periphery and adjoins said at least one first insulating region along said periphery.

4. The capacitance device according to claim 1, wherein:
    said semiconductor region is formed as a well; and said terminal region is formed as a well terminal region of said first conductivity type having a dopant concentration higher than a doping concentration of said semiconductor region.

5. The capacitance device according to claim 4, further comprising a second region of said first conductivity type, said second region:
   being connected to said semiconductor region;
   having a doping concentration higher than said semiconductor region; and
   being connected to said well terminal region.

6. The capacitance device according to claim 1, wherein said gate electrode is formed from a polycrystalline layer.

7. The capacitance device according to claim 1, wherein said gate electrode is a polycrystalline layer.

8. The capacitance device according to claim 1, wherein said first insulating region is an oxide region.

9. The capacitance device according to claim 8, wherein said first insulating region is a shallow trench insulation region.

10. The capacitance device according to claim 9, wherein said second insulating region is an oxide region.

11. The capacitance device according to claim 1, wherein said second insulating region is an oxide region.

12. An integrated, tunable capacitance device, comprising:
   a semiconductor body having a semiconductor region of a first conductivity type, said semiconductor region having a terminal region for applying a tuning voltage;
   at least one first insulating region being introduced into said semiconductor body and having a first layer thickness;
   a second insulating region applied to said semiconductor body adjoining said at least one first insulating region and having a common interface with said semiconductor region, said second insulating region having a second layer thickness less than said first layer thickness;
   a gate electrode on said second insulating region, said semiconductor region having a partial region disposed below said gate electrode, said at least one first insulating region being disposed between said terminal region and said partial region; and
   a region being introduced into said semiconductor body for connection to a reference-ground potential, said region adjoining said semiconductor region, being of a second conductivity type, and having a doping concentration higher than a doping concentration of said semiconductor body, said semiconductor region below said second insulating region under said gate electrode being linked to said region of said second conductivity type and thus to the reference-ground potential to improve a quality factor.

13. An integrated, tunable capacitance device, comprising:
   a semiconductor body having:
      a semiconductor region being of a first conductivity type and having a terminal region for applying a tuning voltage; and
      at least one first insulating region having a first layer thickness;
   a second insulating region at said semiconductor body adjoining said at least one first insulating region and having a common interface with said semiconductor region, said second insulating region having a second layer thickness less than said first layer thickness;
   a gate electrode at said second insulating region, said semiconductor region having a partial region disposed below said gate electrode, said at least one first insulating region being disposed between said terminal region and said partial region; and
   a region being introduced into said semiconductor body for connection to a reference-ground potential, said region adjoining said semiconductor region, being of a second conductivity type, and having a doping concentration higher than a doping concentration of said semiconductor body, said semiconductor region below said second insulating region under said gate electrode being linked to said region of said second conductivity type and thus to the reference-ground potential to improve a quality factor.

14. The capacitance device according to claim 13, wherein said gate electrode completely covers said second insulating region and partly covers said first insulating region.

15. The capacitance device according to claim 13, wherein said gate electrode has a periphery and adjoins said at least one first insulating region along said periphery.

16. The capacitance device according to claim 13, wherein;
   said semiconductor region is formed as a well; and
   said terminal region is formed as a well terminal region of said first conductivity type having a dopant concentration higher than a doping concentration of said semiconductor region.

17. The capacitance device according to claim 16, further comprising a second region of said first conductivity type, said second region:
   being connected to said semiconductor, region;
   having a doping concentration higher than said semiconductor region; and
   being connected to said well terminal region.

18. The capacitance device according to claim 13, wherein said gate electrode is formed from a polycrystalline layer.

19. The capacitance device according to claim 13, wherein said gate electrode is a polycrystalline layer.

20. The capacitance device according to claim 13, wherein said first insulating region is an oxide region.

21. The capacitance device according to claim 20, wherein said first insulating region is a shallow trench insulation region.

22. The capacitance device according to claim 21, wherein said second insulating region is an oxide region.

23. The capacitance device according to claim 13, wherein said second insulating region is an oxide region.

* * * * *